United States Patent
Cha

(10) Patent No.: US 9,133,543 B2
(45) Date of Patent: Sep. 15, 2015

(54) COATING MATERIAL FOR ALUMINUM DIE CASTING MOLD AND METHOD FOR MANUFACTURING THE SAME

(71) Applicant: Hyundai Motor Company, Seoul (KR)

(72) Inventor: Sung-Chul Cha, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/145,213

(22) Filed: Dec. 31, 2013

(65) Prior Publication Data
US 2014/0287214 A1 Sep. 25, 2014

(30) Foreign Application Priority Data
Mar. 19, 2013 (KR) .................. 10-2013-0028911

(51) Int. Cl.
| | |
|---|---|
| *C23C 14/06* | (2006.01) |
| *C23C 14/00* | (2006.01) |
| *C23C 14/16* | (2006.01) |
| *C23C 14/35* | (2006.01) |
| *C23C 28/04* | (2006.01) |
| *B22C 3/00* | (2006.01) |
| *B22D 17/22* | (2006.01) |

(52) U.S. Cl.
CPC ............... *C23C 14/0641* (2013.01); *B22C 3/00* (2013.01); *B22D 17/2209* (2013.01); *C23C 14/0057* (2013.01); *C23C 14/0676* (2013.01); *C23C 14/165* (2013.01); *C23C 14/352* (2013.01); *C23C 28/044* (2013.01); *Y10T 428/24983* (2015.01); *Y10T 428/26* (2015.01)

(58) Field of Classification Search
USPC .......... 204/192.1, 192.15, 192.16; 427/419.1, 427/419.7; 428/216, 217, 336, 469, 472, 428/697, 698, 699
See application file for complete search history.

(56) References Cited

U.S. PATENT DOCUMENTS

| | | | |
|---|---|---|---|
| 6,899,979 B1 | 5/2005 | Mitsui et al. | |
| 8,697,229 B2 * | 4/2014 | Sugita et al. | 428/699 |
| 2012/0052353 A1 | 3/2012 | Sugii et al. | |
| 2012/0315453 A1 * | 12/2012 | Cha et al. | 428/698 |
| 2014/0044944 A1 * | 2/2014 | Cha et al. | 428/336 |
| 2014/0099489 A1 * | 4/2014 | Cha | 428/216 |

FOREIGN PATENT DOCUMENTS

| | | |
|---|---|---|
| JP | 5-195201 B2 | 8/1993 |
| KR | 10-2011-0018459 A | 2/2011 |
| KR | 10-2012-0136938 A | 12/2012 |

* cited by examiner

*Primary Examiner* — Archene Turner
(74) *Attorney, Agent, or Firm* — Mintz Levin Cohn Ferris Glovsky and Popeo, P.C.; Peter F. Corless

(57) ABSTRACT

Disclosed is a coating material for an aluminum die casting mold and a method for manufacturing the same. More particularly, the coating material for an aluminum die casting mold is provided, which is formed on a surface of a base material, and which sequentially comprises a Cr(Si) or Ti layer, a Cr(Si)N or Ti(C)N adhesion layer, a TiAlN/Cr(SiC)N nano-multilayer, and a Cr(SiC)ON layer. The coating material provides superior heat resistance, high temperature stability, and sticking resistance as compared to conventional CrN, TiAlN and AlCrN coating materials, thus extending the lifespan of the mold.

6 Claims, 4 Drawing Sheets

COATING MATERIAL FOR ALUMINUM DIE CASTING MOLD AND METHOD FOR MANUFACTURING THE SAME

CROSS-REFERENCE TO RELATED APPLICATIONS

This application claims priority under 35 U.S.C. §119 to Korean Patent Application No. 10-2013-0028911, filed on Mar. 19, 2013, in the Korean Intellectual Property Office, the disclosure of which is incorporated herein by reference in its entirety.

BACKGROUND OF THE INVENTION

1. Field of the Invention

The present invention relates to a coating material particularly suitable for an aluminum die casting mold and a method for manufacturing the same. More particularly, the coating material has a multilayer structure in which a Cr(Si) or Ti layer, a Cr(Si)N or Ti(C)N layer, a TiAlN/Cr(SiC)N nano-multilayer, and a Cr(SiC)ON layer are sequentially layered, and wherein sticking resistance, durability, and the like of the mold are improved, and a method for manufacturing the same.

2. Description of the Related Art

Recently, automobile companies have actively conducted studies for securing competitiveness in terms of improving fuel efficiency and regulation of exhaust gas. From this viewpoint, the relative importance in the application of aluminum parts, which provide a weight reduction and, thus, are capable of improving fuel efficiency also tends to increase.

Accordingly, the use of aluminum die casting molds also increases, and high-level physical properties are required for the molds. In particular, because of the use environment in which high load and high impact are continually exerted on the molds, the lifespan of the mold is affected by the materials used to form the molds, the mold design, working conditions, heat treatment and surface treatment, and the like. Further, hardness and physical properties of the molds deteriorate due to generation and growth of heat checking caused by thermal impact, generation of sticking and abrasion caused by molten aluminum used in the molds, a thermal softening phenomenon of the material, and coating of the mold surface caused by operating at high temperatures (reaching about 750° C.), and the like.

Therefore, attempts to prevent deterioration in the lifespan of the mold and maintain the performance thereof have been continuously made. In particular, studies for developing a coating material having excellent physical properties, such as sticking resistance, abrasion resistance, low frictionality, heat resistance, oxidation resistance, and the like have been actively conducted. In particular, such coating materials are developed for application to the interior surface of the molds which come into contact with the molten material to be molded.

For example, in the case of molds, nitride, carbide and the like components, based on titanium (Ti), chromium (Cr), and the like are used as surface protection coating materials for implementing complex performances. In particular, in the case of aluminum die casting molds, chromium nitride (CrN), titanium aluminum nitride (TiAlN), aluminum chromium nitride (AlCrN) and the like are often used as coating materials.

However, the titanium aluminum nitride (TiAlN) coating has such a low thermal resistance. As such, titanium aluminum nitride is not suitable for use as a coating material in an aluminum die casting mold, which is exposed to high-temperature environments of up to 750° C. In particular, such nitrides are problematic in terms of thermal stability, and are prone to deterioration in physical properties and the like when exposed to high-temperature environments.

Further, while aluminum chromium nitride (AlCrN) has relatively excellent thermal resistance compared to titanium aluminum nitride (TiAlN), it has such a low sticking resistance that a molten alloy, such as aluminum and the like, easily adheres to the surface of a mold. As such, there are problems with the use of TiAlN, including a decrease in the lifespan of the mold and deterioration in the quality of a casting product produced therefrom.

SUMMARY OF THE INVENTION

The present invention has been made in an effort provide an improved coating material for an aluminum die casting mold. In particular, the present invention provides a coating material having excellent heat resistance, high-temperature stability, and sticking resistance compared to a conventional coating material such as CrN, TiAlN and AlCrN, thus extending the lifespan of a mold thus coated, and a method for manufacturing the same. In particular, the coating material includes a TiAlN/Cr(SiC)N nano-multilayer and a Cr(SiC)ON layer.

According to one aspect, the present invention provides a coating material for an aluminum die casting mold, which is formed on a surface of a base material of the mold (i.e., the surface of the mold on which the coating material is applied), and which sequentially includes a Cr(Si) or Ti layer; a Cr(Si)N or Ti(C)N adhesion layer; a TiAlN/Cr(SiC)N nano-multilayer; and a Cr(SiC)ON layer.

According to preferred embodiments, the Cr(Si) or Ti layer; the Cr(Si)N or Ti(C)N adhesion layer; the TiAlN/Cr(SiC)N nano-multilayer; and the Cr(SiC)ON layer each have a thickness of about 0.1 to 5 µm, respectively. Each of the layers may vary in thickness from each other or may be the same or similar to each other. In general the total thickness of the four layers preferably ranges from about 0.4 to 20 µm.

According to various embodiments of the present invention, the Cr(Si) or Ti layer, the Cr(Si)N or Ti(C)N adhesion layer, the TiAlN/Cr(SiC)N nano-multilayer, and the Cr(SiC)ON layer each have an individual hardness of about 900 to 1,100 HV, about 1,500 to 1,800 HV, about 1,500 to 3,000 HV, and about 2,500 to 3,000 HV, respectively.

According to further embodiments of the present invention, the TiAlN/Cr(SiC)N nano-multilayer has a ratio of Ti:Al:Cr=about 1:1:1.

According to another aspect, the present invention provides a method for manufacturing a coating material for an aluminum die casting mold, including: coating a Cr(Si) or Ti layer on a surface of a base material (i.e., the surface of the mold) using a Cr target (220), CrSi target (240) or a TiAl target (230); coating a Cr(Si)N or Ti(C)N adhesion layer on the coated Cr(Si) or Ti layer using the CrSi target (240) or the TiAl target (230); coating a TiAlN/Cr(SiC)N nano-multilayer on the coated Cr(Si)N or Ti(C)N adhesion layer using the Cr target (220) and the TiAl target (230), or the Cr target (220), the TiAl target (230), and a CrSi target (240); and coating a Cr(SiC)ON layer on the coated TiAlN/Cr(SiC)N nano-multilayer using the Cr target (220), or the Cr target (220) and the CrSi target (240).

The present invention having the aforementioned configuration has an effect of providing a high-temperature stability that is better than that of a conventional TiAlN coating material (i.e., there is essentially no change in physical properties even when the coating material of the present invention is left to stand at 750° C. for 3 hours).

Further, the present invention is advantageous in that the coating material has far better sticking resistance than the CrN, TiAlN or AlCrN coating material in the related art (i.e., no sticky residue is observed even when carrying out a dipping and rotating test in a molten metal at 700° C. for 3 to 27 hours).

In addition, the coating material according to the present invention is resistant to heightened temperatures of about 950° C. or more, which is an excellent result. In particular, after the coating material of the present invention is left to stand at a heightener temperature of about 800° C. to about 1,000° C., the thickness of the oxidized layer was confirmed to be about 200 nm.

Furthermore, the coating material of the present invention has excellent physical properties and has an extended lifespan of about 48 to 166% or more as compared to the lifespan of conventional coating materials. Further, physical properties of the mold coated with the present coating material are maintained even in a rigorous environment. As such, the coating material of the present invention is advantageous in extending the lifespan of the mold and reducing and even eliminating mold maintenance costs.

Other features and aspects of the present invention will be apparent from the following detailed description, drawings and claims.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
FIGS. 1 and 2 are photographs illustrating that sticking occurs to an insert and a core pin, respectively, of a conventional aluminum die casting mold which is not coated.

It should be understood that the appended drawings are not necessarily to scale, presenting a somewhat simplified representation of various preferred features illustrative of the basic principles of the invention.

In the figures, reference numbers refer to the same or equivalent parts of the present invention throughout the several figures of the drawing.

DETAILED DESCRIPTION OF THE EMBODIMENTS

Hereinafter, the present invention will be described in detail with reference to the accompanying drawings.

Figure 2:
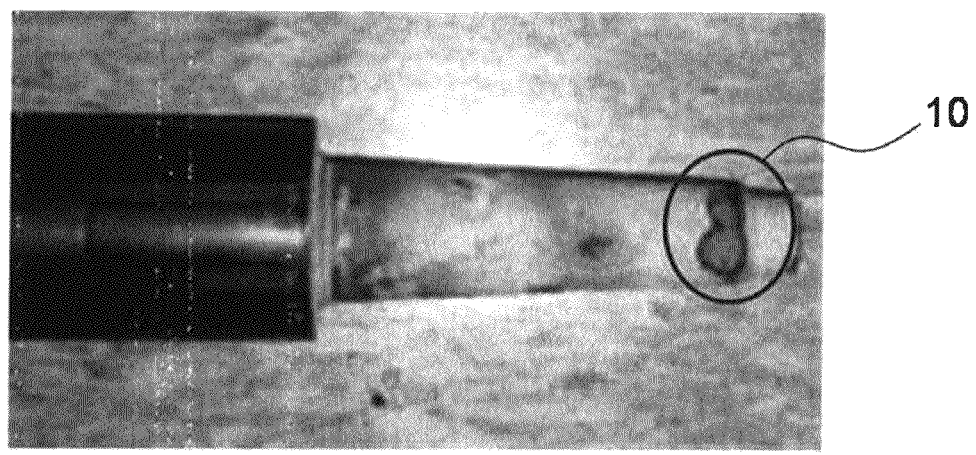

FIGS. 1 and 2 are photographs illustrating that sticking occurs to an insert and a core pin of an aluminum die casting mold, respectively, which have not been coated.

As illustrated in FIGS. 1 and 2, when casting is performed using an aluminum die casting mold, a sticky residue 10 caused by aluminum molten metal often forms. This sticky residue 10 decreases the hardness of the surface of the mold, and causes the generation of leaks, fracture in the mold, and the like. The formation of such a sticky residue 10 is principally responsible for a decrease in the lifespan of the mold.

Meanwhile, high-level physical properties are required for the aluminum die casting mold to be used in a rigorous condition caused by extremely high voltage and high cycle. In attempt to achieve these required properties, TiAlN or AlCrN have been conventionally used as a coating material. However, such coating materials are problematic due to their inadequate heat resistance, lack of high temperature stability, insufficient sticking resistance, and the like. As such, these coating materials are limited in their ability to extend the lifespan of the mold.

In one aspect, the present invention relates to a coating material that solves the aforementioned problems.

Figure 3:
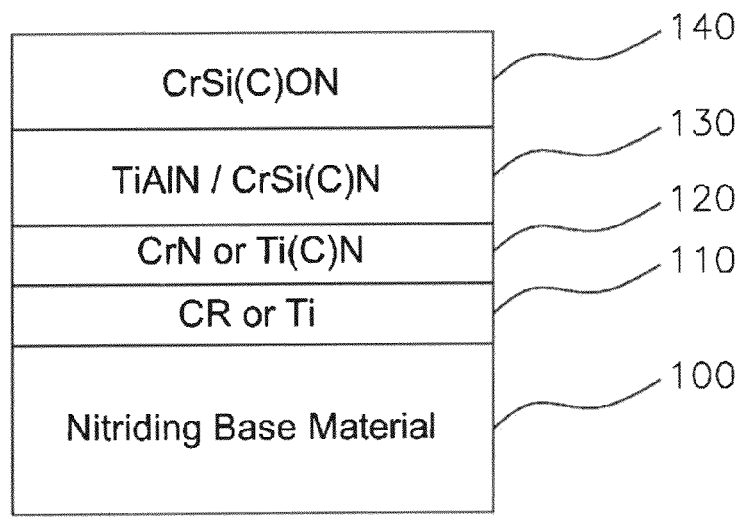
FIG. 3 is a view illustrating the structure of a coating material according to an embodiment of the present invention.

FIG. 3 is a view illustrating the structure of the coating material according to an embodiment of the present invention.

As illustrated in FIG. 3, the coating material according to the present invention has a multilayer structure formed on the surface of the base material 100. According to preferred embodiments, the coating material has a multilayer structure sequentially including a Cr(Si) or Ti layer 110; a Cr(Si)N or Ti(C)N adhesion layer 120; a TiAlN/Cr(SiC)N nano-multilayer 130; and a Cr(SiC)ON layer 140, respectively.

According to various embodiments, the base material may additionally include a nitriding layer applied prior to application of the multilayer coating material. Preferably, such a base material includes a nitriding layer having a thickness of about 80 to 120 μm by a nitriding treatment. According to, preferred embodiments, the hardness of the nitriding layer is greater than that of the base material and, for example, the hardness of the base material may be about 400 to 500 HV and the hardness of the nitriding layer may be about 600 to 900 HV.

The Cr(Si) or Ti layer 110 serves to increase the adhesion force with the base material and to provide an increased hardness greater than the base material in a stepwise fashion (i.e., such that the hardness increases from the base material to each of the sequential layers). Further, in embodiments wherein the nitriding treatment is not conducted (and, thus, a nitriding layer is not included), the Cr(Si) or Ti layer 110 also serves to improve toughness due to reinforcement of the thickness of the coating, and for this purpose, the thickness of the Cr(Si) or Ti layer 110 is preferably about 0.1 to 5 μm, and the hardness is preferably about 900 to 1,100 HV, more preferably about 1,000 HV.

Further, the Cr(Si)N or Ti(C)N adhesion layer 120 serves to increase adhesion force with the base material, lower and adjust the residual stress of the coating, and improve toughness, fatigue resistance, impact resistance, and the like. According to preferred embodiments, the Cr(Si)N or Ti(C)N adhesion layer 120 has a hardness of about 1,500 to 1,800 HV.

In addition, the TiAlN/Cr(SiC)N nano-multilayer 130 serves as a support layer, which improves heat resistance, oxidation resistance, abrasion resistance, toughness, and the like, which are characteristics that are required for an aluminum die casting mold. In particular, TiAlN serves to impart heat resistance, oxidation resistance, and abrasion resistance, while Cr(SiC)N serves to improve sticking resistance, low frictionality, and toughness. According to preferred embodiments, the hardness of the TiAlN/Cr(SiC)N nano-multilayer 130 is about 1,500 to 3,000 HV. In order to provide the TiAlN/Cr(SiC)N nano-multilayer as a support layer which improves the heat resistance, oxidation resistance, abrasion resistance, and toughness of the base material, it is preferred that the ratio of Ti:Al:Cr is about 1:1:1 in consideration of the cross lamination of each layer for maximizing the desired effects.

In order to form the nano-multilayer structure, the targets may be arranged symmetrically and the product rotated to coat the corresponding target material as desired.

Furthermore, the Cr(SiC)ON layer 140 serves as a functional layer which reinforces sticking resistance and low frictionality, which are main characteristics of the coating material according to the present invention. According to preferred embodiments, the hardness of the Cr(SiC)ON layer 140 is about 2,500 to 3,000 HV.

Abrasion resistance and impact resistance are physical properties that generally conflict with each other and, thus, it is very difficult to simultaneously improve both of these properties. However, the present invention enables simultaneous improvement by using the Cr(Si)N or Ti(C)N adhesion layer 120 which has excellent impact resistance, and the TiAlN/Cr(SiC)N nano-multilayer 130 which has excellent abrasion resistance.

According to preferred embodiments, the Cr(Si)N or Ti(C)N adhesion layer 120 has a thickness of about 0.1 to 5 µm. When the thickness of the Cr(Si)N or Ti(C)N adhesion layer 120 is less than 0.1 µm, it is not sufficient to exhibit the desired function. On the other hand, when the thickness of the Cr(Si)N or Ti(C)N adhesion layer 120 is more than 5 µm, there is concern in that a peeling-off phenomenon of the coating layer may occur.

According to preferred embodiments, the TiAlN/Cr(SiC)N nano-multilayer 130 and the Cr(SiC)ON layer 140 also have a thickness of about 0.1 to 5 µm, respectively. When the thickness of each of the TiAlN/Cr(SiC)N nano-multilayer 130 and the Cr(SiC)ON layer 140 are individually less than 0.1 µm, it is difficult to form a multilayer structure obtained by mixing two different layers, thereby making it difficult to exhibit the effects of the present invention. On the other hand, when the thickness of each of the TiAlN/Cr(SiC)N nano-multilayer 130 and the Cr(SiC)ON layer 140 are individually more than 5 µm, the coherency strain between the two different layers may be disrupted, thereby leading to a decrease in hardness.

As described above, the coating material according to the present invention preferably has a multi-stepwise structure in which the hardness is gradually increased from the base material to each sequential layer. AS such, the coating material has an effect in that the generation of cracks due to the multilayer coating by the layered structure is delayed or inhibited from occurring.

In another aspect, the present invention relates to a method for manufacturing the coating material.

In general, methods of coating the surface of a metal base material with a coating material are largely classified into a physical vapor deposition (PVD) method and a chemical vapor deposition (CVD) method. While any of these methods could be used to form the present coating material, it is preferred that the PVD method is applied.

The PVD method is a dry processing method of depositing an ionized metal material on the surface of a material (base material) to be targeted by electrical attraction while a cathode is applied on the base material and the ionized metal material is supplied in a vapor state. This method allows for the formation of a uniform coating on the surface of the base material and increases adhesion force using fine ion particles.

According to preferred embodiments, the present invention adopts a PVD method using arc, high power impulse magnetron sputtering (HIPIMS), and inductive coupled plasma (ICP) in order to make particles of the coating material nano-sized and implement a high-speed coating.

Figure 4:
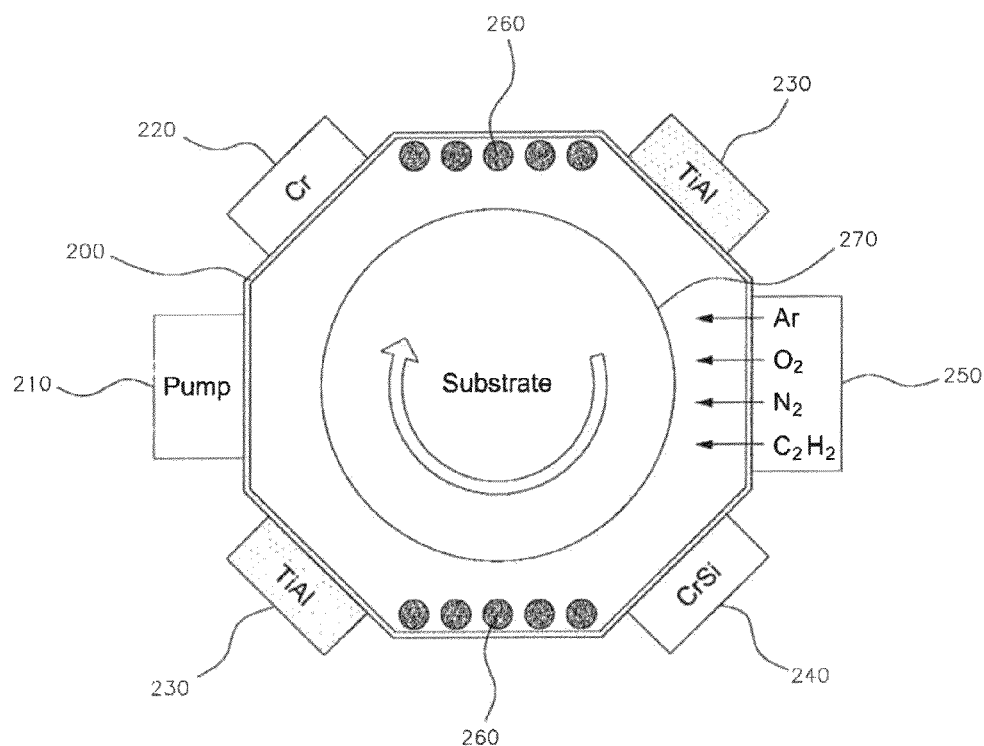
FIG. 4 is a view illustrating a PVD (Physical Vapor Deposition) apparatus for manufacturing the coating material according to an embodiment of the present invention.

FIG. 4 is a view illustrating a PVD (Physical Vapor Deposition) apparatus for manufacturing the coating material according to an embodiment of the present invention.

As illustrated in FIG. 4, the PVD device includes a chamber 200; a pump 210, a Cr target 220, a TiAl target 230, a CrSi target 240, a gas introducing unit 250, and a heating unit 260 that are provided on the chamber 200; and a mold substrate (base material) mounted on a rotation holder 270 in the chamber 200. According to various embodiments, a mold substrate with the surface thereof having been subjected to nitriding treatment may be used as the base material, if desired.

The Cr or CrN layer is first coated using the Cr target (220). However, the Cr target (220) cannot be used alone when Si is added to the layer, and thus, in such cases, the CrSi target (240) must be used.

According to preferred embodiments, first, as a pre-treatment step of the coating, the inside of the chamber 200 is evacuated using the pump 210 to maintain the inside in a vacuum state. Subsequently, a plasma state is created by introducing argon gas thereinto through the gas introducing unit 250.

The surface of the mold is cleaned and activated by heating the chamber 200 using the heating unit 260 and applying a bias voltage on the mold to allow argon positive ions to collide with the surface of the mold ("baking & cleaning").

Subsequently, the Cr(Si) or Ti layer 110 having excellent adhesion force with the base material is coated on the surface of the base material 100 to a thickness of preferably about 0.1 to 5 µm using the Cr target 220, CrSi target 240 or the TiAl target 230.

Thereafter, a nitrogen atmosphere is formed by introducing nitrogen gas ($N_2$) into the chamber through the gas introducing unit 250. According to some embodiments, $C_2H_2$ gas is also introduced together thereinto, if necessary. Thereafter, the residual stress of the coating is lowered and adjusted using the Cr target 220, CrSi target (240), or the TiAl target 230. As a result, the Cr(Si)N or Ti(C)N adhesion layer 120, which is responsible for toughness, fatigue resistance, and impact resistance, is coated to a thickness of preferably about 0.1 to 5 µm.

The Cr(Si) or Ti layer 110 serves to increase the adhesion force with the base material and hardness of the base material stepwise. Particularly, in embodiments in which the nitriding treatment is not conducted on the base material, the Cr(Si) or Ti layer 110 also serves to improve toughness due to reinforcement of the thickness, and for this purpose, the thickness is preferably about 0.1 to 5 µm, and the hardness is preferably about 900 to 1,100 HV and more preferably about 1,000 HV.

Further, the Cr(Si)N or Ti(C)N adhesion layer 120 serves to increase adhesion force with the base material, lower and adjust the residual stress of the coating, and improve toughness, fatigue resistance, impact resistance, and the like. According to preferred embodiments, the Cr(Si)N or Ti(C)N adhesion layer 120 has a hardness of about 1,500 to 1,800 HV. At this time, compared to Cr and CrN coating, CrSi and CrSiN coating, when the layers are coated by lowering the existing plasma power (60 eV) and coating speed to no greater than about 40%, an appropriate hardness of about 1000 HV and about 1500 to 1800 HV may be obtained respectively. Further, the CrSi and CrSiN layers may have difficulty in increasing the hardness stepwise due to the hardness of about 1200 HV and about 1800 HV, respectively, caused by the densification of the structure when the existing power is maintained.

Thereafter, TiAl ions are reacted with Cr ions using the TiAl target 230 for supplying TiAl ions and the Cr target 220 for supplying Cr ions. As a result, the TiAlN/Cr(SiC)N nano-multilayer 130 is coated to a thickness of preferably about 0.1 to 5 μm by additionally using the CrSi target 240, if necessary.

At this time, the TiAlN/Cr(SiC)N nano-multilayer 130 is formed as a support layer which improves the heat resistance, oxidation resistance, abrasion resistance, and toughness of the base material. Preferably, the ratio of Ti:Al:Cr in the TiAlN/Cr(SiC)N nano-multilayer 130 is preferably about 1:1:1 in consideration of the Cr lamination of each layer for maximizing the desired effects, and the layer is preferably be coated in an amount of about 0.1 to 40 atomic % when Si or C is added thereto.

Thereafter, an oxygen atmosphere is formed by introducing oxygen gas ($O_2$) into the chamber through the gas introducing unit 250. At this time, the Cr(SiC)ON layer 140, which implements sticking resistance, heat resistance, oxidation resistance, and abrasion resistance, is coated to a thickness of preferably about 0.1 to 5 μm using the Cr target 220, the CrSi target 240, and process gasses $O_2$, $N_2$, and $C_2H_2$. At this time, the Cr(SiC)ON layer 140 may be coated in an amount of about 0.1 to 40 atomic % when Si or C is added thereto.

EXAMPLE

Hereinafter, the present invention will be described in more detail through the Examples. These Examples are only for illustrating the present invention, and it will be obvious to those skilled in the art that the scope of the present invention is not interpreted to be limited by these Examples.

Table 1 is a table comparing a conventional TiAlN coating material (Comparative Example 1) and a conventional AlCrN coating material (Comparative Example) in the related art with the coating material according to an embodiment of the present invention (Example 1)

At this time, the hardness was measured by indenting a sample with an indenter loaded with an ultramicro load (micro indenter, 0.05 N, 0.7 μm indenting depth). The adhesion force was measured as a load at which peeling-off occurred for the first time by increasing the load applied on a diamond tip until the coated surface was peeled off. A method of making a groove in a line was carried out by applying force on the coated surface with the diamond tip. The thickness was measured by observing the sample using a microscope after pressure was applied on the surface of the sample using a steel bead. The hardness was measured after the sample was maintained/cooled in a temperature range of 400° C. to 700° C. in an oven for 1 to 10 hours, and the change in values before and after the treatment was compared. The sticking resistance was obtained by measuring the weight loss before and after the treatment in a temperature range of no greater than 800° C.

As shown in the Table 1, the oxidation temperature of the coating material according to the present invention was 950° C., which was higher than the oxidation temperatures of the TiAlN coating material (Comparative Example 1) and the AlCrN coating material (Comparative Example 2). Thus, it was demonstrated that the coating material according to the present invention had better heat resistance than the conventional coating materials.

In addition, the hardness of the coating material according to the present invention was 2,827 HV, and the hardness of the coating material according to the present invention after the coating material was left to stand at a high temperature was 2,812 HV. Thus, it was demonstrated that the change in physical properties was small compared to the results of the conventional coating materials (Comparative Examples 1 and 2). This verifies that the high temperature stability of the coating material according to the present invention is better than that of the conventional coating materials.

Figure 5:
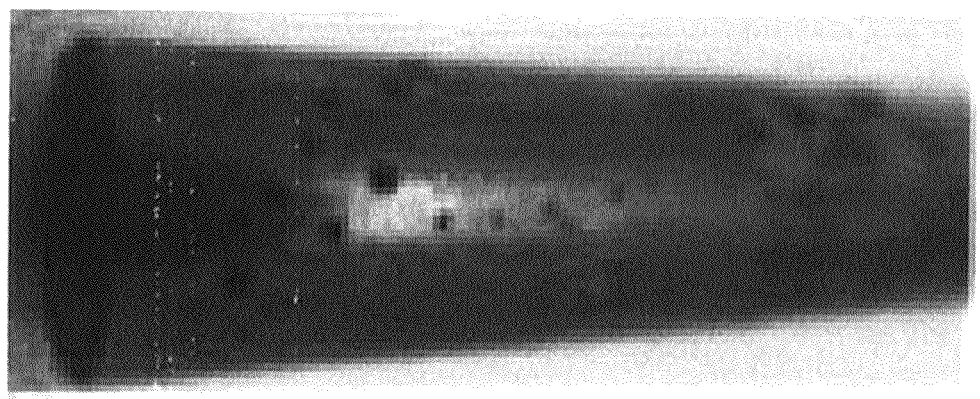
FIGS. 5 and 6 are photographs illustrating the results of molds, which are respectively coated with TiAlN and AlCrN coating materials in accordance with conventional methods, that are dipped and rotated in an aluminum molten metal at 700° C. for 6 hours, and then washed with sodium hydroxide.
Figure 6:
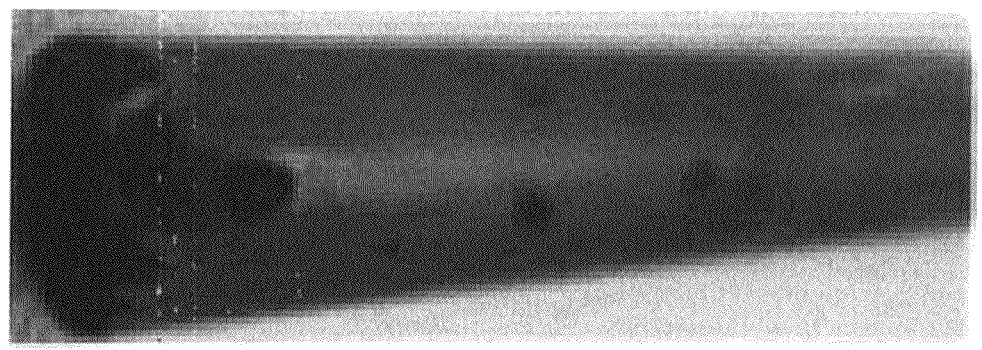
Figure 7:
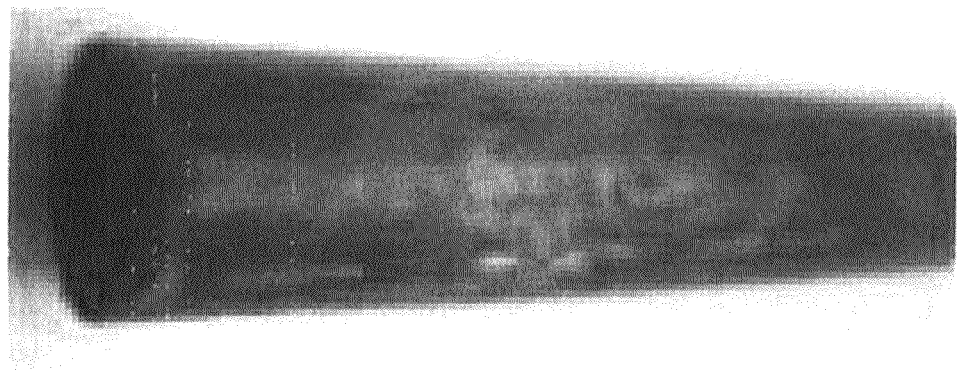
FIG. 7 is a photograph illustrating the result of a mold, coated with the coating material according to an embodiment of the present invention, dipped and rotated in an aluminum molten metal at 700° C. for 27 hours, and then washed with sodium hydroxide.

FIGS. 5 and 6 are photographs illustrating the results of the molds, which were respectively coated with the conventional TiAlN and AlCrN coating materials, which were dipped and rotated in an aluminum molten metal at 700° C. for 6 hours, and then washed with sodium hydroxide. Further, and FIG. 7 is a photograph illustrating the result of the mold, which was coated with the coating material according to the present invention, which was dipped and rotated in an aluminum molten metal at 700° C. for 27 hours, and then washed with sodium hydroxide.

The sodium hydroxide was used in order to remove the aluminum sticky residue, and as illustrated in the photographs, it was confirmed that surface defects were excessively found on the mold coated with the conventional coating material, while surface defects were not found on the mold coated with the coating material according to the present invention even in a more rigorous conditions. This is because sticking resistance of the mold was been significantly improved by the coating material according to the present invention.

As described above, the coating material according to the present invention has better oxidation resistance, heat resistance, hardness, sticking resistance, and the like as compared to the conventional coating materials. As such, the present coating material can effectively provide savings of maintenance costs (i.e., costs for maintaining molds), improvement of productivity, and the like resulting from the extension of the lifespan of the aluminum die casting mold.

As described above, the present invention has been described in relation to specific embodiments of the present

TABLE 1

|  | Comparative Example 1 | Comparative Example 2 | Example 1 |
| --- | --- | --- | --- |
| Surface treatment/Coating | TiAlN | AlCrN | TiAlCrN—CrSiCON |
| Processing method | PVD | PVD | PVD |
| Thickness (μm) | 10.5 (5CrN—5.5TiAlN) | 10.42 (5CrN—5.42AlCrN) | 10.29 (4.5CrSiN—5.1TiAlN/CrSiCN—0.69CrSiCON) |
| Adhesion force (N) | 49.2 | 48.3 | 52 |
| Hardness (HV) | 3179 | 3252 | 2827 |
| Hardness after left to stand at high temperature (HV) | 2850 | 3203 | 2812 |
| Oxidation temperature (° C.) | 850 | 900 | 950 |
| Sticking resistance | Insufficient | Insufficient | Very excellent | invention, but this is only illustration and the present invention is not limited thereto. Embodiments described may be changed or modified by those skilled in the art to which the present invention pertains without departing from the scope of the present invention, and various alterations and modifications are possible within the technical spirit of the present invention and the equivalent, scope of the claims which will be described below.

What is claimed is:

1. A coating material for an aluminum die casting mold, for application to a surface of a base material of the mold, the coating material comprising in sequence:
    a Cr(Si) or Ti layer;
    a Cr(Si)N or Ti(C)N adhesion layer;
    a TiAlN/Cr(SiC)N nano-multilayer; and
    a Cr(SiC)ON layer.

2. The coating material of claim 1, wherein the Cr(Si) or Ti layer, the Cr(Si)N or Ti(C)N adhesion layer, the TiAlN/Cr(SiC)N nano-multilayer, and the Cr(SiC)ON layer each have a thickness of about 0.1 to 5 µm, respectively.

3. The coating material of claim 1, wherein the Cr(Si) or Ti layer has a hardness of about 900 to 1,100 HV, the Cr(Si)N or Ti(C)N adhesion layer has a hardness of about 1,500 to 1,800 HV, the TiAlN/Cr(SiC)N nano-multilayer has a hardness of about 1,500 to 3,000 HV, and the Cr(SiC)ON layer has a hardness of about 2,500 to 3,000 HV.

4. The material of claim 1, wherein the TiAlN/Cr(SiC)N nano-multilayer has a ratio of Ti:Al:Cr=about 1:1:1 and has Si or C in an amount of about 0.1 to 40 atomic %.

5. A method for manufacturing a coating material for aluminum die casting mold, the method comprising:
    coating a Cr(Si) or Ti layer on a surface of a base material using a Cr target, CrSi target, or a TiAl target;
    coating a Cr(Si)N or Ti(C)N adhesion layer on the Cr(Si) or Ti layer using the Cr target, the CrSi target, or the TiAl target;
    coating a TiAlN/Cr(SiC)N nano-multilayer on the CrN or Ti(C)N adhesion layer using the Cr target and the TiAl target, or the Cr target, the TiAl target, and a CrSi target; and
    coating a Cr(SiC)ON layer on the TiAlN/Cr(SiC)N nano-multilayer using the Cr target, or the Cr target and the CrSi target.

6. The method of claim 5, wherein each of the coatings are formed using a physical vapor deposition (PVD) method.

* * * * *